United States Patent [19]

Moyer

[11] Patent Number: 5,374,844
[45] Date of Patent: Dec. 20, 1994

[54] BIPOLAR TRANSISTOR STRUCTURE USING BALLAST RESISTOR

[75] Inventor: James C. Moyer, San Jose, Calif.

[73] Assignee: Micrel, Inc., San Jose, Calif.

[21] Appl. No.: 197,658

[22] Filed: Feb. 17, 1994

Related U.S. Application Data

[63] Continuation-in-part of Ser. No. 37,062, Mar. 25, 1993, abandoned.

[51] Int. Cl.$^5$ .............................................. H01L 29/72
[52] U.S. Cl. .................................. 257/582; 257/538; 257/578; 257/581
[58] Field of Search ............... 257/580, 581, 582, 538, 257/577, 578, 579

[56] References Cited

U.S. PATENT DOCUMENTS

| | | | |
|---|---|---|---|
| 3,918,080 | 5/1975 | Kerr | 257/581 |
| 4,417,265 | 11/1983 | Murkland et al. | 257/580 |
| 4,500,900 | 2/1985 | Shimizu | 257/580 |
| 4,626,886 | 12/1986 | Tihanyi | 357/34 |
| 4,639,757 | 1/1987 | Shimizu | 257/580 |
| 4,656,496 | 4/1987 | Widlar | 257/580 |
| 4,686,557 | 8/1987 | Mahrla | 257/580 |
| 4,769,688 | 9/1988 | Cotton | 257/580 |
| 4,835,588 | 5/1989 | Nawata et al. | 257/580 |
| 5,111,269 | 5/1992 | Tsugaru | 257/582 |

FOREIGN PATENT DOCUMENTS

| | | | |
|---|---|---|---|
| 3329241 | 2/1985 | Germany | 257/580 |
| 0127064 | 10/1980 | Japan | 257/582 |
| 0024264 | 2/1986 | Japan | 257/580 |
| 0126229 | 5/1991 | Japan | 257/580 |

*Primary Examiner*—Rolf Hille
*Assistant Examiner*—David Ostrowski
*Attorney, Agent, or Firm*—Skjerven, Morrill, MacPherson, Franklin & Friel

[57] ABSTRACT

A transistor structure incorporates a polysilicon layer which is doped with N-type dopants and is used as an emitter ballast resistor in an array of NPN transistors. In one embodiment, the polysilicon layer is also used as a diffusion source to form N-type emitter regions within a deep and high resistivity P-well, which acts as a relatively high value base ballast resistor for the transistor. In another embodiment, a standard base is used, contributing little base ballast resistance. A buried collector region carries collector current. Preferably, the emitter regions are formed as oblong strips. P-type base contact regions, also generally formed as oblong strips, are formed in the surface of this P-well parallel to the emitter regions. The dimensions of the base contact regions may be varied in order to achieve a constant base-emitter voltage along the entire length of each emitter strip. An emitter metal layer overlies the polysilicon layer and contacts the polysilicon layer through openings in an insulating layer. The resulting three dimensional structure in one embodiment thus incorporates a stacked collector region, base ballast resistor, base region, emitter regions, emitter ballast resistors, and emitter metal layer. In another embodiment, the same three dimensional structure results except that there is no base ballast resistor. Dimensions of the emitter metal layer and other metal layers may be adjusted so that the transistor structure has a trapezoidal shape and requires less silicon real estate.

27 Claims, 10 Drawing Sheets

BIPOLAR TRANSISTOR STRUCTURE USING BALLAST RESISTOR

CROSS-REFERENCE TO RELATED APPLICATION

This is a continuation-in-part of U.S. patent application Ser. No. 08/037,062, filed Mar. 25, 1993, now abandoned.

FIELD OF THE INVENTION

This invention relates to integrated circuits and in particular to a bipolar transistor structure.

BACKGROUND OF THE INVENTION

It is generally desirable that transistors in integrated circuits generate constant, predictable currents even with changing temperatures. Without any temperature compensation circuitry, the current through a bipolar transistor increases due to the increasing beta of the transistor with temperature.

In relatively high-current applications, it is common to connect a number of transistors in parallel, whereby each transistor contributes a portion of the total current. In this parallel configuration, each transistor is generally designed to be identical and is designed to generate its allocated current at a specified operating temperature. However, if one of these transistors connected in parallel were to become hotter than the other transistors, this hotter transistor would draw more current than the other transistors. This increased current would raise the temperature of that transistor, which would then additionally raise the current through that transistor, and thus raise the temperature even higher. This thermal runaway continues until the transistor is destroyed by the heat overload.

Figure 1A:
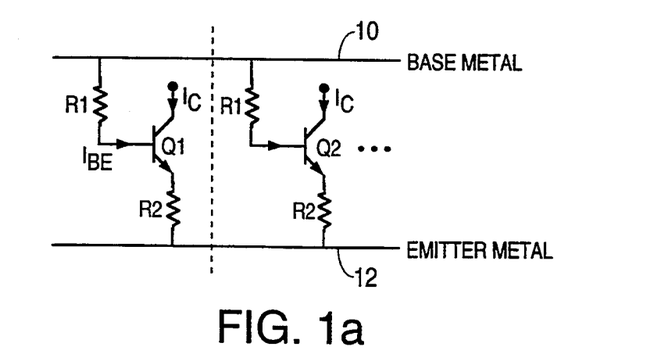
FIG. 1a is a schematic diagram illustrating parallel-connected transistors and their ballast resistors.

In an attempt to prevent this thermal runaway from happening, ballast resistors are sometimes used as shown in FIG. 1a.

FIG. 1a illustrates a number of identical NPN bipolar transistors being connected in parallel. Only transistors Q1 and Q2 are shown for simplicity. The transistors Q1 and Q2 are shown with a base ballast resistor R1 connected to the base metal 10, so that a transistor's base current flows through its base ballast resistor R1. An emitter ballast resistor R2 is shown connecting the emitters of transistors Q1 and Q2 to the emitter metal 12, so that a transistor's emitter current flows through its emitter ballast resistor R2.

Figure 1B:
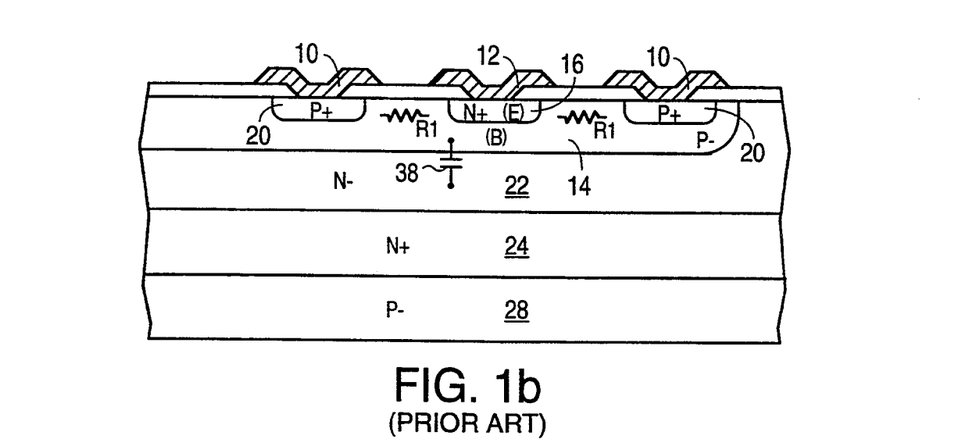
FIGS. 1b, 1c, and 1d are cross-sections of transistor structures illustrating three ways to form ballast resistors.
Figure 1C:
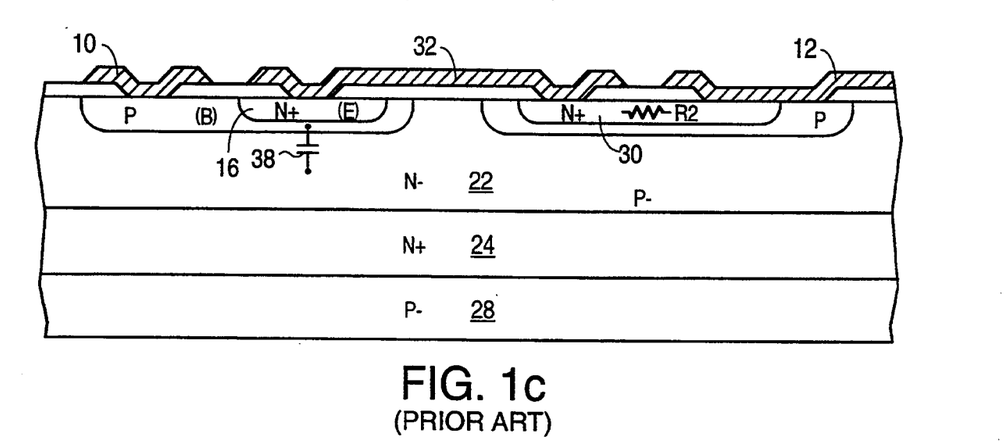
Figure 1D:
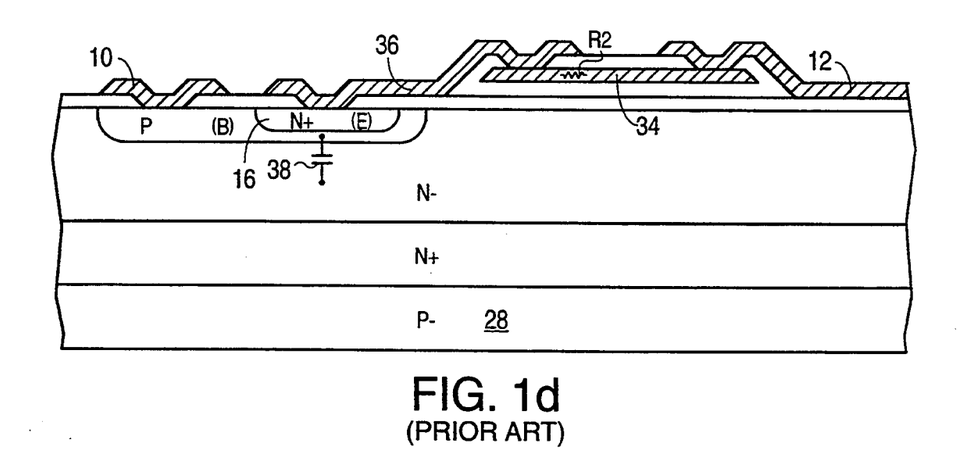

FIGS. 1b, 1c, and 1d are cross-sectional views of known embodiments of transistor Q1 or Q2 incorporating a base ballast resistor or an emitter ballast resistor.

FIG. 1b illustrates a transistor having an inherent base ballast resistor R1. Base metal 10 and emitter metal 12 are connected to the base region 14 (through base pick-up region 20) and the emitter region 16, respectively. Typically, the base ballast resistor R1 is a small value and is formed by the intrinsic resistance of the base P-well 14 in which the N-type emitters 16 are formed. Also shown in FIG. 1b is an N-epitaxial/collector layer 22, an N+ buried collector region 24, and a P− substrate 28.

The intrinsic base ballast resistor R1 works as follows. An increased temperature of transistor Q1 results in an increased emitter current ($I_E$) through transistor Q1 and a lowering of the transistor's base-emitter voltage ($V_{BE}$). This draws an additional base current ($I_B$) through the base ballast resistor R1 and slightly lowers the base voltage applied to transistor Q1. This reduced $V_{BE}$ causes transistor Q1 to be less conductive so as to partially counteract the increased beta due to the increased temperature. If base ballast resistor R1 were of a sufficient resistance, this resistor R1 would provide adequate temperature compensation circuitry for the transistor. However, using the standard base diffusion as the ballast resistor is not very effective due to the typically low resistance (e.g., 100-200 ohms/square) of the standard base diffusion and the very small change in base current with respect to emitter current.

A much more efficient way to provide this temperature compensation of transistors Q1 and Q2 is using an emitter ballast resistor R2, shown in FIGS. 1c and 1d. An increased current through resistor R2 will lower the emitter voltage of transistor Q1 or Q2 and hence lower the $V_{BE}$. Since any increase in emitter current through transistor Q1 or Q2 will be much greater than any increase in the base current, only a relatively small emitter ballast resistor R2 need be used to dramatically lower the $V_{BE}$ of the transistor when emitter current is increased due to an increased temperature of transistor Q1 or Q2.

One popular form of emitter ballast resistor R2 is shown in FIG. 1c and is implemented using an N+ diffusion resistor 30 as an emitter series resistor. Metal 12 contacts one end of the emitter series resistor 30, and a metal connector 32 connects the other end of resistor 30 to the emitter region 16.

Another popular form of emitter ballast resistor R2 is a separate, extrinsic polysilicon resistor 34, shown in FIG. 1d, where each polysilicon resistor 34 is connected between the emitter metal 12 and an emitter region 16 of a transistor using a metal connector 36.

In the prior art, such as shown in FIGS. 1b, 1c, and 1d, the standard base diffusion for the NPN transistor has a typical resistivity of 100-200 ohms/square. The standard base diffusion is fairly shallow, on the order of 3 microns deep. This high doping level of the standard base diffusion enables the standard base diffusion to contain the relatively large amount of charge required to avoid punch-through breakdown of the transistor at the operating voltage.

A number of drawbacks exist with the prior art structures of FIGS. 1b, 1c, 1d, and similar structures. One drawback is that the intrinsic base ballast resistor R1 formed by the resistivity of the standard base diffusion is small and has relatively little effect on the temperature/current compensation of the resulting transistor. Additionally, the intrinsic pinch resistor in the shallow standard base diffusion under emitter 16 is a relatively high resistance and, during the turn-off transient, the dV/dt current through the base/collector parasitic capacitor 38 causes a voltage drop across the pinch resistor which may effectively keep the transistor turned on even after the transistor was intended to be turned off. Additionally, when the transistor is on, the high value pinch resistor in the base diffusion under the emitter region 16 prevents the portion of the transistor under the emitter region 16 farthest from the base contact from turning fully on.

Further, since the base ballast resistor R1 is of a low value, the emitter ballast resistor R2 must be made a relatively high value to obtain the necessary temperature compensation for the transistor. This high-value emitter ballast resistor R2 undesirably causes the output saturation voltage of the transistor to be higher.

Still further, the emitter ballast resistors require a large amount of silicon real estate solely dedicated to these resistors, and the values of these resistors are directly affected by mask alignments.

Accordingly, the prior art transistors and ballast resistors have significant operational drawbacks and size drawbacks.

It is therefore desirable in the field of high power transistor integrated circuits to form more efficient emitter and base ballast resistors. It is also desirable to form transistors in parallel for high current applications, where each transistor exhibits identical characteristics when in an operational environment so that each transistor will conduct a same amount of current. It is also desirable to form these transistors using a minimum of process steps and a minimum of die area.

SUMMARY OF THE INVENTION

The present invention is a transistor structure and method for forming the transistor structure. In one embodiment, the transistor structure comprises a plurality of NPN bipolar transistors, formed in parallel, using a lightly doped P-well as a base having a resistivity of approximately 3KΩsquare. This lightly doped P-well is made relatively deep (e.g., 5–7 microns) to achieve the desired charge in the P-well. This deep P-well avoids any turn-on of the transistors when the base/collector parasitic capacitor discharges across the pinch resistors formed in the P-well, since any pinching effects under the emitter will be relatively small due to the depth of the P-well. The relatively high resistivity of the P-well forms a higher value base ballast resistor in a smaller area. This improves the temperature compensation characteristics of the transistors. Additionally, when building BiCMOS devices, this lightly doped P-well may also be used for the body region of N-channel MOS transistors, which require a lightly doped channel region.

Further, to form the N+ emitter regions within the P-well, an N-doped polysilicon layer is used as a diffusion source for the emitters. The resistive polysilicon layer also inherently forms the emitter ballast resistors. In a preferred method using polysilicon as the diffusion source, there is no need for a special doping mask to form the emitter regions, and the emitter regions are self-aligned to the polysilicon ballast resistors. The resulting emitters may be made very narrow, due to there being no need to align an emitter contact to the emitters, so that the resulting transistors may be faster, smaller, and more densely packed than prior art transistors. Furthermore, the smaller emitter size increases the emitter's periphery-to-area ratio, thereby further improving transistor gain characteristics.

An emitter metal layer is then formed over the polysilicon layer and contacts the polysilicon layer in selected areas. In the preferred embodiment, the N+ emitter regions are formed in narrow parallel strips so as to form a linear array of transistors with a common base and collector. The pitch between the emitter metal/polysilicon contact areas and the N+ emitter regions is varied along the length of the transistor array to compensate for the cumulative increase in resistance of the emitter metal layer with increasing distance from the source of the emitter bias voltage. This results in the metal resistance plus polysilicon resistance for each of the transistors to be a constant so that each transistor will have identical operating characteristics.

Still further, P+ base contact strips, connecting base metal to the P-well, are formed spaced from and in parallel with the N+ emitter strips. The P+ base contact strips are varied in width along their length, based upon the base bias voltage ($V_B$) along the length of the P+ strips, so as to maintain a uniform $V_{BE}$ along the length of the emitter strips. The pitch of the P+ base contact strips may also be varied to compensate for any base metal resistance.

As seen, the resulting transistor structure is ballasted in both the base and the emitter. The base and the emitter ballast resistors are formed concurrently with the basic transistor structure and are formed in a way to better distribute bias potentials and current to the bases and emitters of the transistors. Voltage drops in the distribution network for both the emitters and the base can be accommodated by straightforward modification of the layout around the individual emitter sites.

Further, the base ballast resistor, the emitter ballast resistor, and the primary emitter bus metal are stacked on top of each other and occupy the same silicon real estate.

Still further, the base ballast resistor is intimately connected to and distributed along the intrinsic base region, and the emitter ballast resistor is intimately connected to and distributed along the emitter. This intimate connection and continuous distribution of the ballast resistors provides the best possible protection for the transistor and enables the emitters and emitter ballast resistors to be formed at the level of the reproducible feature size.

Still further, in order to form an extremely dense, two dimensional array of transistors, the geometry of the emitter metal may be made to taper, like a triangle, to take into account the decreasing current through the emitter metal along the linear array of transistors. This tapering allows the collector metal to be tapered in a complementary fashion and, thus, improves the utilization of both collector and emitter metal. For both the collector and the emitter metal, the metal is narrow where the current is small and wide where the current is large. This improved utilization of the metal permits the entire structure to be made smaller.

In accordance with another embodiment, a standard P base having a resistivity of approximately 120–130 ohms/square is used. This standard base is approximately three microns thick. P+ contact strips, approximately four microns thick, are formed as stated above. This transistor structure works well at high voltages.

DETAILED DESCRIPTION OF THE PREFERRED EMBODIMENT

Figure 2:
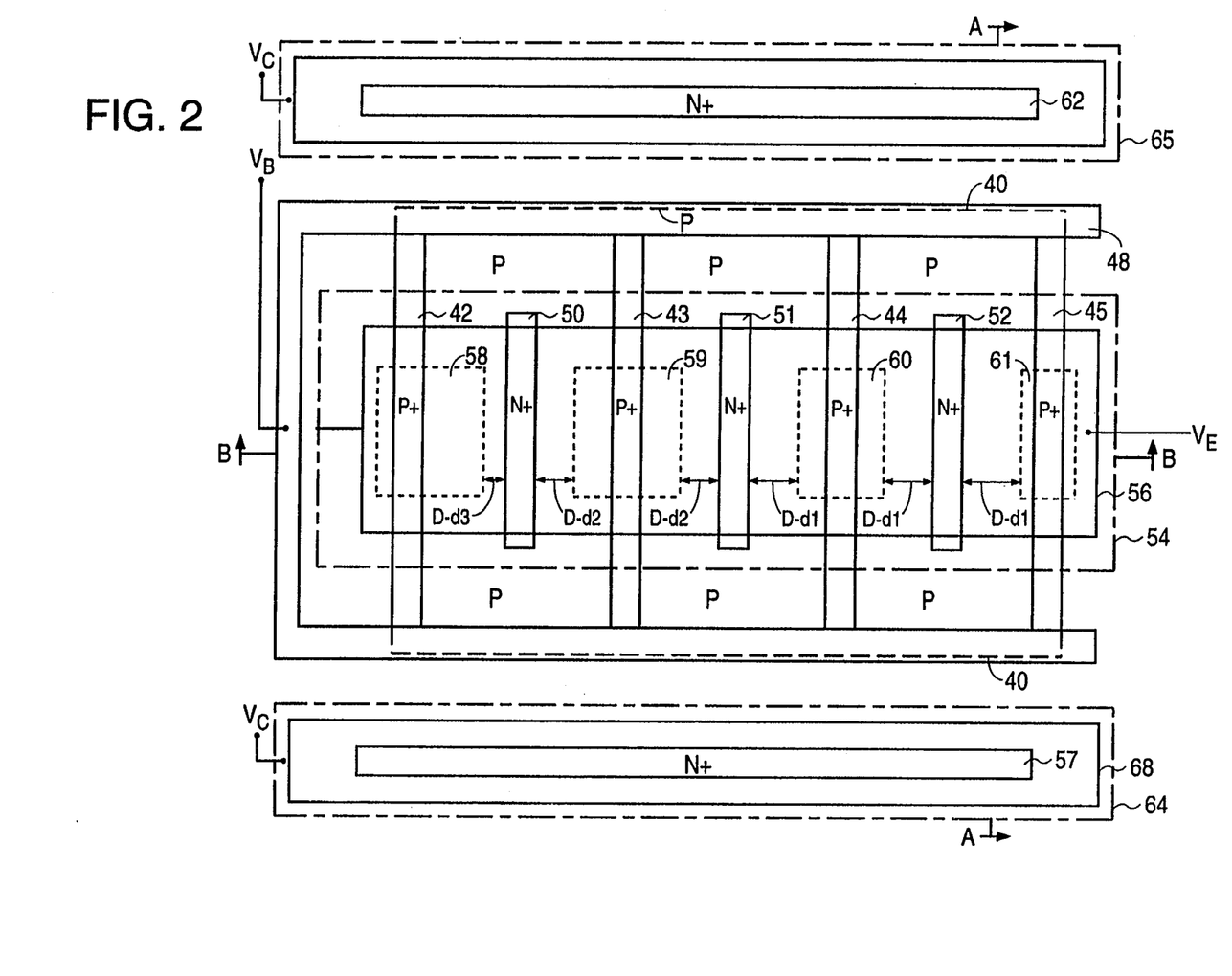
FIG. 2 is a top plan view illustrating a composite of various masks used to form the transistor structure of the present invention and also showing the various conductivity types of the formed regions.

FIG. 2 illustrates a transistor structure incorporating certain aspects of the present invention. The present invention may, however, be incorporated in a wide variety of transistor structures. FIG. 2 is a top plan view of the various doped regions, polysilicon layer, metal layer, and masks which are used to form the transistor structure. In FIG. 2, only three NPN bipolar transistors are shown in parallel; however, many more transistors may be formed in an identical manner to increase the power handling capability of the resulting transistor structure.

An overview of FIG. 2 will be presented followed by a detailed description of the preferred method used for forming the structure of FIG. 2.

FIG. 2 shows a dashed outline of a lightly doped and deep P-well 40, which is essentially rectangular and acts as a base region for the three bipolar transistors. P-well 40 is formed by doping a rectangular region in an N-type epitaxial layer.

Within P-well 40 are formed strips of P+ regions 42, 43, 44, and 45, which are shallow regions for providing a low resistivity base contact across P-well 40.

A base metal pattern 48 contacts the P+ regions 42–45 at their ends. Thus, a base voltage $V_B$ applied to base metal 48 at the left side of FIG. 2 will provide a voltage of approximately $V_B$ along the length of each of the P+ regions 42–45 and energize P-well 40 with approximately the base voltage $V_B$.

N+ emitter regions 50, 51, and 52 are formed within P-well 40 using an N-doped polysilicon layer 54 as an N-dopant diffusion source. Polysilicon layer 54 is outlined using alternating long and short dashes. This polysilicon layer 54 also acts as an emitter ballast resistor, as will be described below.

Overlying and insulated from polysilicon layer 54 is an emitter metal layer 56 (shown by a bold outline), which supplies an emitter bias voltage $V_E$ to selected areas of polysilicon layer 54 and carries emitter current to N+ emitter regions 50–52.

To utilize polysilicon layer 54 as an emitter ballast resistor, contact openings 58, 59, 60, and 61 are formed in an insulating oxide layer between polysilicon layer 54 and the overlying emitter metal 56 where indicated by rectangular dotted outlines. Emitter metal 56 contacts the underlying polysilicon layer 54 within the boundaries of the contact openings 58–61. The polysilicon layer 54 portion located between an edge of contact openings 58–61 and its closest emitter region 50–52 acts as an emitter ballast resistor between the emitter metal 56 and an emitter region 50–52.

Thus, polysilicon layer 54 forms the emitter regions 50–52 and the emitter ballast resistors in a single deposition step, and the emitter ballast resistors are self-aligned with the emitter. This efficient method results in a predictable emitter ballast resistor value for each of the transistors, and the ballast resistor requires no additional silicon real estate. Also, utilizing the unitary polysilicon layer 54 as ballast resistors for a number of transistors results in a more efficient utilization of the underlying silicon, as compared to forming individual, laterally-spaced ballast resistors for each transistor.

Since the base P-well 40, emitter regions 50–52, polysilicon layer 54, and emitter metal 56 are stacked in a three-dimensional structure, silicon real estate is very efficiently used.

To compensate for the inherent resistivity of the emitter metal 56, the widths of the polysilicon ballast resistors, located between the edges of contact openings 58–61 and the closest N+ emitter region 50–52, are incrementally narrowed along the length of emitter metal 56 so that the sum of the metal 56 resistance and the polysilicon ballast resistance for each transistor is the same for each of the transistors. Thus, the effective emitter ballast resistance is the same for each transistor, resulting in each transistor having a same operational environment.

The variation in the widths of the polysilicon ballast resistors is illustrated by the designation of the distance between contact opening 61 and emitter region 52 being D; the distance between contact opening 60 and emitter regions 52 and 51 being D-d1; the distance between contact opening 59 and emitter regions 51 and 50 being D-d2; and the distance between contact opening 58 and emitter region 50 being D-d3, wherein d1 is less than d2, and d2 is less than d3.

As will be illustrated in the following process steps, P-well 40 is made deeper and more lightly doped than prior art base diffusions previously used for the bases of NPN bipolar transistors. The deep and lightly doped P-well 40 has a higher resistivity than prior art base diffusions and thereby provides a higher value base ballast resistor. Further, since P-well 40 is relatively deep, the pinch resistors under emitter regions 50–52 are not of a sufficiently high resistance to cause an inadvertent turn-on due to any parasitic capacitor discharge through the pinch resistor when the transistor has just been turned off.

An N+ buried layer under the transistor structure of FIG. 2 acts as a collector region and is terminated by N+ collector sinker regions 57 and 62, which extend down to contact the N+ buried layer. The deep N+ sinker regions 57 and 62 are formed by ion implantation or using predeposition, followed by drive-in. The same polysilicon layer 54 that was used as an N-doping diffusion source to form emitter regions 50–52 is used to additionally dope the surface of the N+ sinker regions 57 and 62 to lower the contact resistance between the collector metal 66 and 68 and the N+ sinker regions 57 and 62. These polysilicon layer portions for additionally doping the collector sinker regions 57 and 62 are designated in FIG. 2 as polysilicon portions 64 and 65.

Collector metal portions 66 and 68 overlie and contact the surface of polysilicon layer portions 65 and 64, respectively, in order to conduct the collector current through the transistor structure. The collector bias voltage $V_C$ is shown connected to an end of collector metal portions 66 and 68.

Additional features of the present inventive transistor structure will be further explained during a discussion of the preferred method for forming the structure of FIG. 2.

Figure 3:
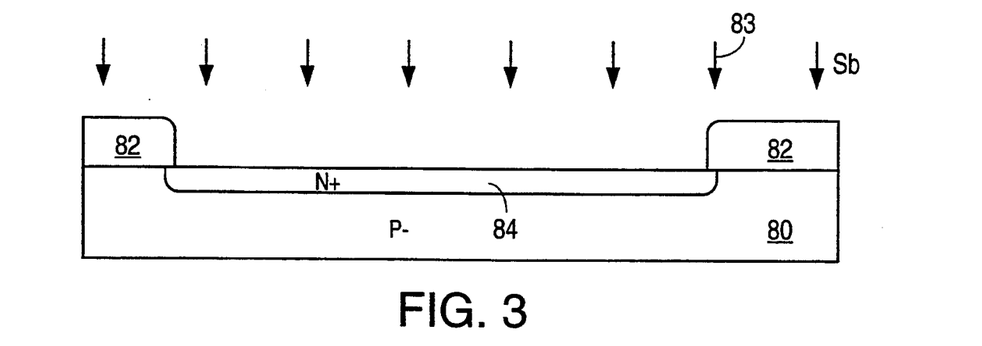
FIGS. 3, 4, 5, 6a, 9b, and 10b are cross-sectional views of the transistor structure of FIG. 2 along line A—A during various steps used to form the preferred embodiment of FIG. 2.

FIG. 3 is a side view in cross-section of the transistor structure of FIG. 2 taken along line A—A.

FIG. 3 shows a starting P— silicon substrate 80 over which is formed a patterned oxide layer 82, formed using conventional photolithographic and etching techniques, for defining an area in which an N+ buried collector region 84 is to be formed. In one embodiment, P− substrate 80 has a resistivity of approximately 6 ohm-cm. Resistivity values between 1 ohm-cm and 20 ohm-cm may also be acceptable.

Instead of patterned oxide being used as a mask in this process, patterned photoresist may be used, or, patterned photoresist may be used in conjunction with an oxide layer when appropriate.

Slow-diffusing N-type dopants, such as antimony (Sb) ions 83, are then implanted into the exposed surface of substrate 80 at an energy of approximately 80 KeV and at a dose of approximately $5E15/cm^2$. Other doping methods, such as predeposition or spin-on, may be substituted for any implantation step described herein. The implanted ions form N+ buried region 84. The final depth of N+ buried region 84 and its dopant concentration are dependent upon the desired electrical characteristics for the resulting transistor structure. For a deep N+ buried collector region 84, the N-type Sb dopants may be driven-in for approximately 8 hours at a temperature of approximately 1250° C. until the dopants are driven-in to a depth of approximately 8 microns, although the temperature and time may be varied depending on the desired depth. A typical resulting dopant concentration in the N+ buried collector region 84 may be approximately $1E19/cm^3$.

Figure 4:
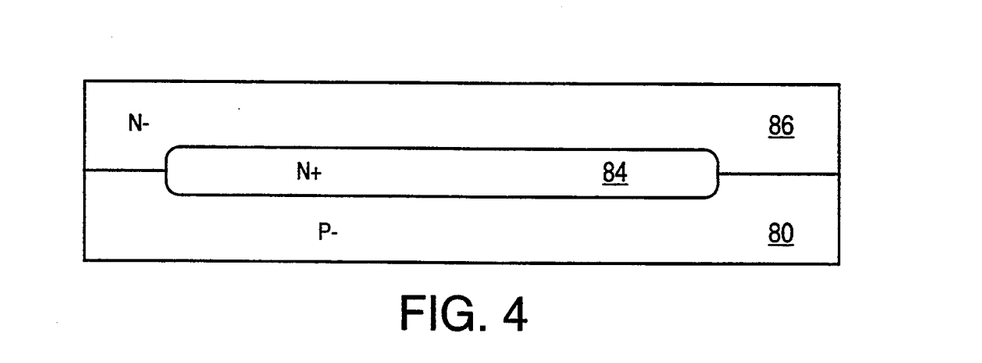

Next, as shown in FIG. 4, oxide layer 82 is removed and an N-type epitaxial layer 86 is grown over the substrate 80 using well-known conventional techniques. During the growth of this epitaxial layer 86, the N-type dopants in buried region 84 will up-diffuse into epitaxial layer 86.

In one embodiment, N-type epitaxial layer 86 has a resistivity of approximately 3 ohms-cm and is grown over the surface of substrate 80, using conventional techniques, at a temperature of approximately 1200° C. until epitaxial layer 86 is approximately 13 microns thick. The N-type dopants in buried layer 84 will diffuse up approximately 6 microns into epitaxial layer 86.

Figure 5:
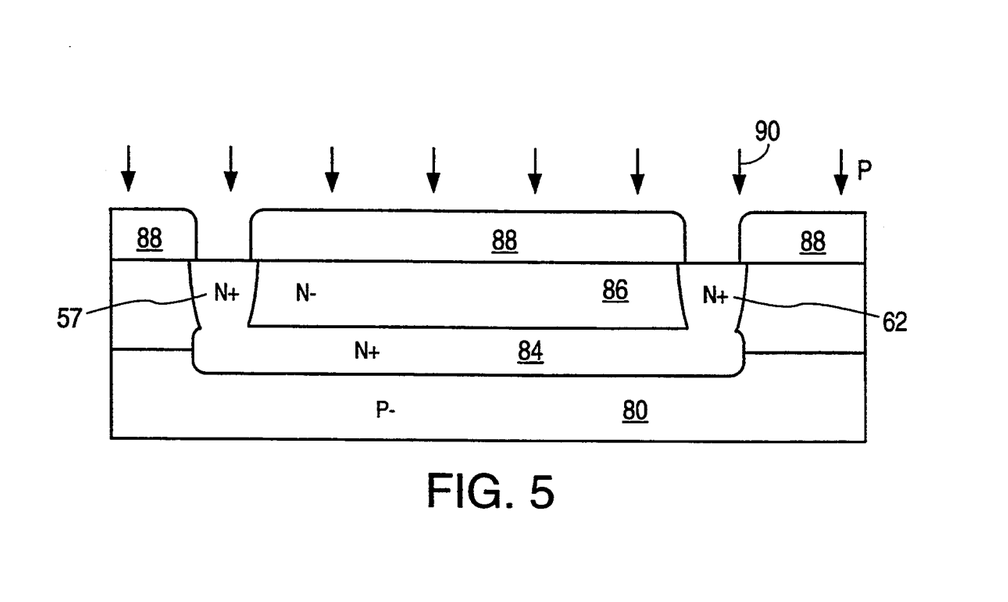

As shown in FIG. 5, taken along line A—A in FIG. 2, the surface of the resulting wafer is then patterned with a layer of oxide 88 to expose portions of epitaxial layer 86 where N+ sinker regions 57 and 62 are to be formed to contact the buried layer 84. Fast-diffusing phosphorus atoms 90 are then predeposited into the exposed portions of epitaxial layer 86 at approximately 1000° C. and driven-in at such a temperature (e.g., 1200° C.) and time so as to form a vertical, low-resistivity path between the surface of epitaxial layer 86 and buried layer 84. For a very thick epitaxial layer 86, a conventional up-down diffusion process may also be used to form N+ sinker regions 57 and 62 so as to minimize side-diffusion.

Oxide layer 88 is then removed.

Figure 6A:
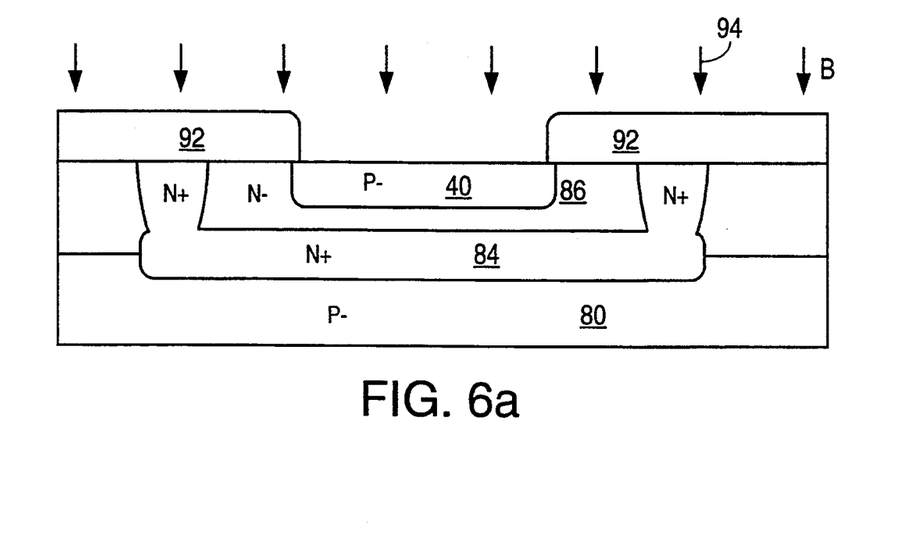

As shown in FIG. 6a, also taken along line A—A in FIG. 2, a layer of oxide 92 is then grown or deposited on the surface of the wafer and patterned using conventional photolithographic techniques to expose a surface portion of epitaxial layer 86 in which it is desired to form a P-well 40 to act as a common base region for the NPN transistor structure.

Next, P-type boron ions 94 are then implanted into the exposed portion of epitaxial layer 86 at an energy of approximately 100 KeV and at a dose of approximately $1E13$ ions/$cm^2$. The boron ions 94 are then driven-in in a dry $O_2$ atmosphere or mixed $N_2/O_2$ atmosphere at approximately 1100° C. to form P-well 40 having a resistivity of approximately 3 kΩ per square and a depth of approximately 5–7 microns. This preferred resistivity of P-well 40 is much higher than the typical base diffusion resistivity of only 100–200 ohms per square.

In an alternative embodiment, P-well 40 may have a resistivity of between 1 kΩ/square and 5 kΩ/square, and a depth of greater than seven microns.

Elsewhere on the wafer (not shown), this boron implant may be used to form lightly doped P-wells for N-channel MOS transistors, which require such lightly doped P-wells as the body regions of the transistors.

To now illustrate the formation of the three NPN transistors shown in FIG. 2, reference will be made to FIGS. 6b, 7, 8, 9a, and 10a, which show cross-sections of the structure of FIG. 2 taken along line B—B, cutting across the three transistors. FIGS. 9b and 10b are taken along line A—A in FIG. 2 to illustrate the collector sinker portion of the transistor structure.

Figure 6B:
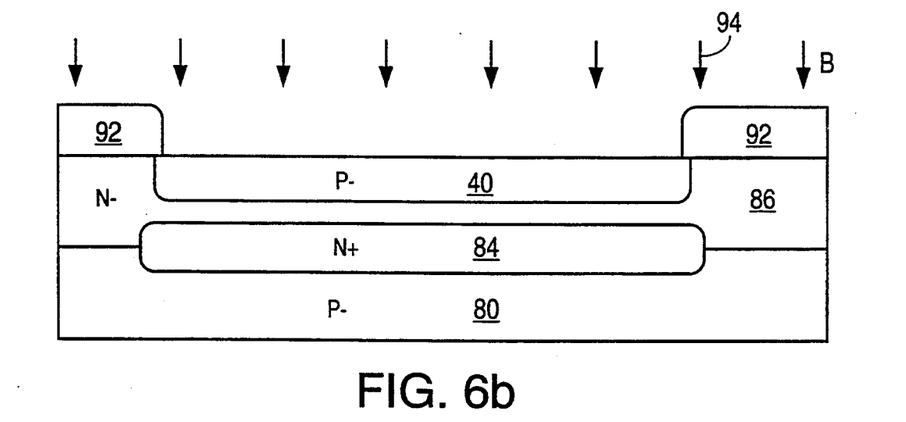
FIGS. 6b, 7, 8, 9a, and 10a are cross-sectional views of the transistor structure of FIG. 2 along line B—B during various steps used to form the preferred embodiment of FIG. 2.

In FIG. 6b, the same step as described with respect to FIG. 6a is shown but along line B—B in FIG. 2. As seen, this cross-sectional view does not include the N+ sinker regions 57 and 62, and P-well 40 is shown to have a greater width.

Figure 7:
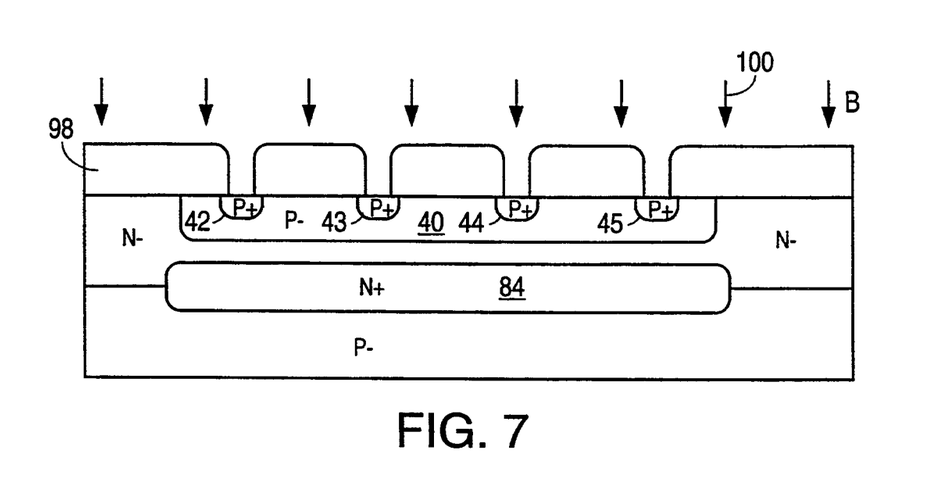

In a next step of the preferred process, as shown in FIG. 7, a layer of oxide 98 is then formed and patterned to expose surface portions of P-well 40 where it is desired to form P+ base contact regions 42, 43, 44, and 45. These P+ base contact regions are formed in strips and correspond to P+ base contact regions 42–45 in FIG. 2.

Boron ions 100 are then implanted into the exposed portions of P-well 40 at an energy of approximately 40 KeV and a dose of approximately $5E14$ ions/$cm^2$. These boron ions 100 may be later driven-in during subsequent heating steps for forming additional layers of oxide and other layers. These resulting P+ base contact regions 42–45, after being driven-in, will have depths of approximately 3.0 microns.

Figure 8:
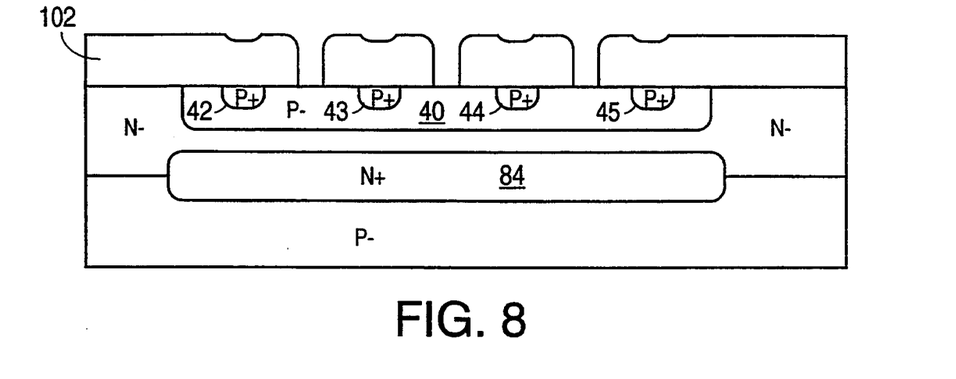

As shown in FIG. 8, oxide layer 92 is removed and a new oxide layer 102 is now formed and patterned to expose portions of P-well 40 between the base contact regions 42–45 where N+ emitter regions are to be formed.

Figure 9A:
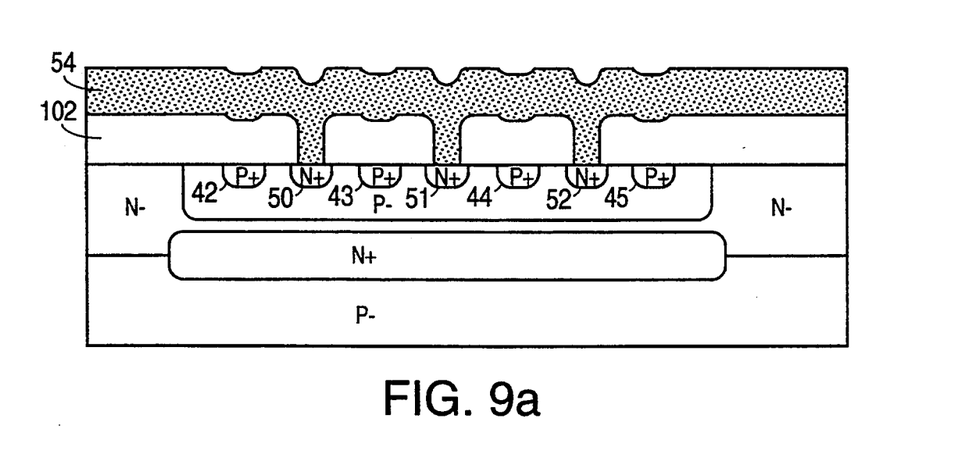
Figure 9B:
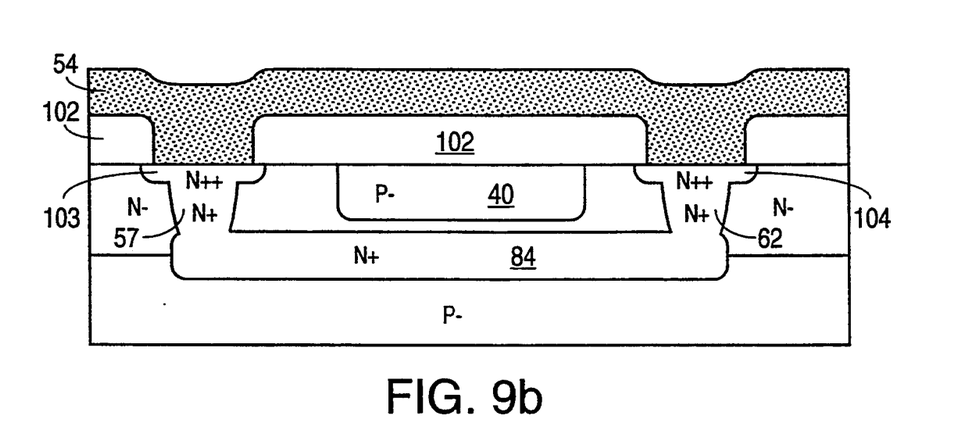

Next, as shown in FIG. 9a, a layer of N-type polysilicon 54 is then deposited over the surface of the wafer so as to come in contact with the exposed surface portions of P-well 40 where N-type emitters are desired. The doped polysilicon layer 54 is deposited using well-known techniques. In one embodiment, the polysilicon layer 54 is doped with phosphorus ions with a concentration of approximately $5E15/cm^3$. The wafer is then heated at approximately 950° C. for approximately 30 minutes to cause the N-type ions in polysilicon layer 54 to diffuse into P-well 40 and to be driven-in to a depth of approximately 2.0 microns to form N+ emitter regions 50, 51, and 52 having a dopant concentration on the order of $1E19/cm^3$.

These resulting emitter regions 50–52 can be made very narrow (i.e., the minimum width of the oxide 102 opening), since no subsequent mask alignments to emitter regions 50–52 are required. Narrow emitter regions are desirable for high speed switching transistors and enable more transistors to be formed in a given area.

FIG. 9b shows the same step shown in FIG. 9a except FIG. 9b is taken along line A—A of FIG. 2 so as to show patterned oxide layer 102 exposing surface portions within N+ sinker regions 57 and 62 and to show polysilicon layer 54 contacting surface portions 103 and 104 of N+ sinker regions 57 and 62. Doped polysilicon layer 54 serves to additionally dope the surface portions 103 and 104 of sinker regions 57 and 62 with N-type dopants, resulting in improved contact to sinker regions 57 and 62.

Figure 10A:
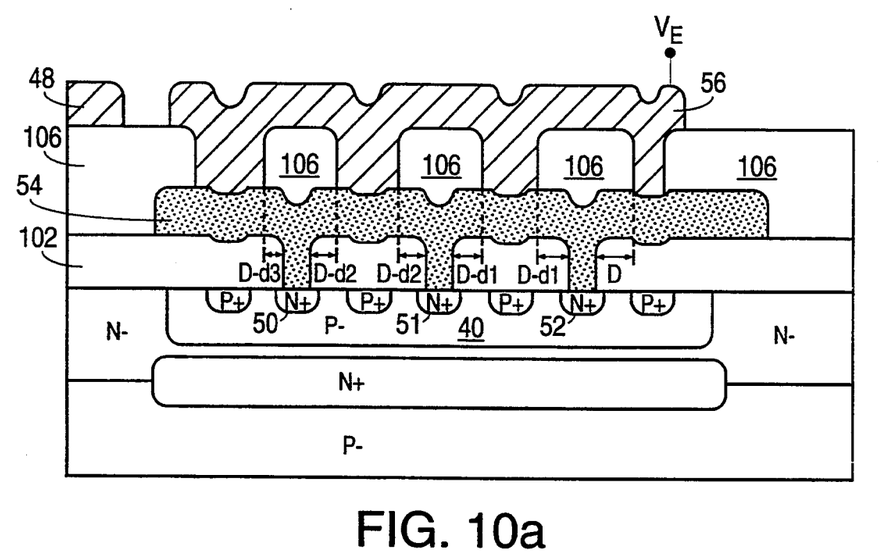
Figure 10B:
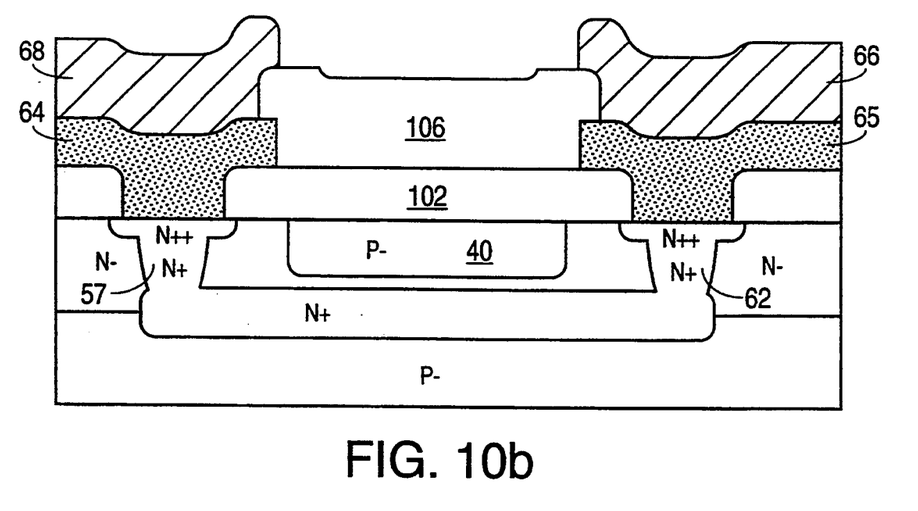

Polysilicon layer 54 is then etched as shown in FIG. 10a (taken along line B—B in FIG. 2) to leave the polysilicon layer 54 over the central portion of the transistor structure to act as a polysilicon ballast resistor for each of the three NPN transistors. Polysilicon layer 54 is also etched to form polysilicon regions 64 and 65 in FIG. 10b (taken along line A—A in FIG. 2) overlying sinkers 57 and 62. This is also shown in FIG. 2.

As also shown in FIG. 10a, a layer of oxide 106 is then deposited and patterned in order to expose portions of polysilicon layer 54 where it is desired to contact polysilicon layer 54 with an emitter metal layer 56. A metal layer, such as aluminum, is then deposited over the surface of the wafer and etched to remove unwanted portions. FIG. 10a shows the contact between emitter metal 56 and polysilicon 54. A top view of the contact areas between emitter metal 56 and polysilicon 54 is shown in FIG. 2 by the dotted outlines of contact regions 58–61.

FIG. 10a also shows a portion of base metal 48 also formed during the metal etching step. The base metal 48 pattern is shown in FIG. 2. The base metal 48 contacts the P+ base contact regions 42–45 at their ends. In effect, the P+ base contact regions 42–45 act as lateral underpasses which allow the polysilicon 54 ballast resistors and emitter metal 56 to cover the entire central portion of the transistor structure.

FIG. 10b is taken along line A—A in FIG. 2 and shows where oxide 106 has been etched away to expose polysilicon portions 64 and 65. FIG. 10b also shows collector metal portions 68 and 66 after etching.

Referring back to FIG. 10a, FIG. 10a also illustrates the relative distances through polysilicon 54 which current must travel between emitter metal 56 and the nearest N+ emitter region 50–52, where the distance through polysilicon 54 determines the resistance value of the polysilicon emitter ballast resistor for each of the three NPN transistors. It should be appreciated that the polysilicon ballast resistors are distributed on both sides of each emitter so that emitter current is effectively shared by two polysilicon resistors. This efficiently utilizes the available silicon real estate, increases the dissipation of heat, and improves the reliability of the device.

In FIG. 10a the emitter voltage $V_E$ is connected to emitter metal 56 at the right side of emitter metal 56. Emitter metal 56 inherently exhibits a certain amount of resistance between the point at which the emitter voltage source contacts the emitter metal 56 and where emitter metal 56 contacts polysilicon 54. When emitter current flows through emitter metal 56, the resistance of metal 56 causes an increasing voltage drop along the length of metal 56 which could cause a base-emitter bias voltage to be different for each of the three NPN transistors shown in FIG. 10a. To provide the same $V_E$ to each of emitter regions 50–52, the increasing resistance of metal 56 along the length of emitter metal 56 is compensated for by inversely varying the resistances (i.e., the lengths) of the polysilicon ballast resistors between the emitter metal 56 and each of N+ emitter regions 50–52. The relative lengths of the polysilicon ballast resistors are designated in FIG. 10a and have been previously described with respect to FIG. 2.

The transistor structure shown in FIGS. 2, 10a, and 10b is simplified for illustration purposes. In an actual embodiment of this transistor structure, there are fourteen emitter regions (i.e., fourteen transistors), and this number may be increased to increase the power handling capability and/or speed of the transistor structure.

The resulting transistor structure of FIGS. 2, 10a, and 10b is thus formed in a very efficient manner and contains numerous improvements over the prior art.

The overall structure of the device shown in FIG. 2 lends itself to numerous modifications which improves its performance and reduces its size.

Figure 11:
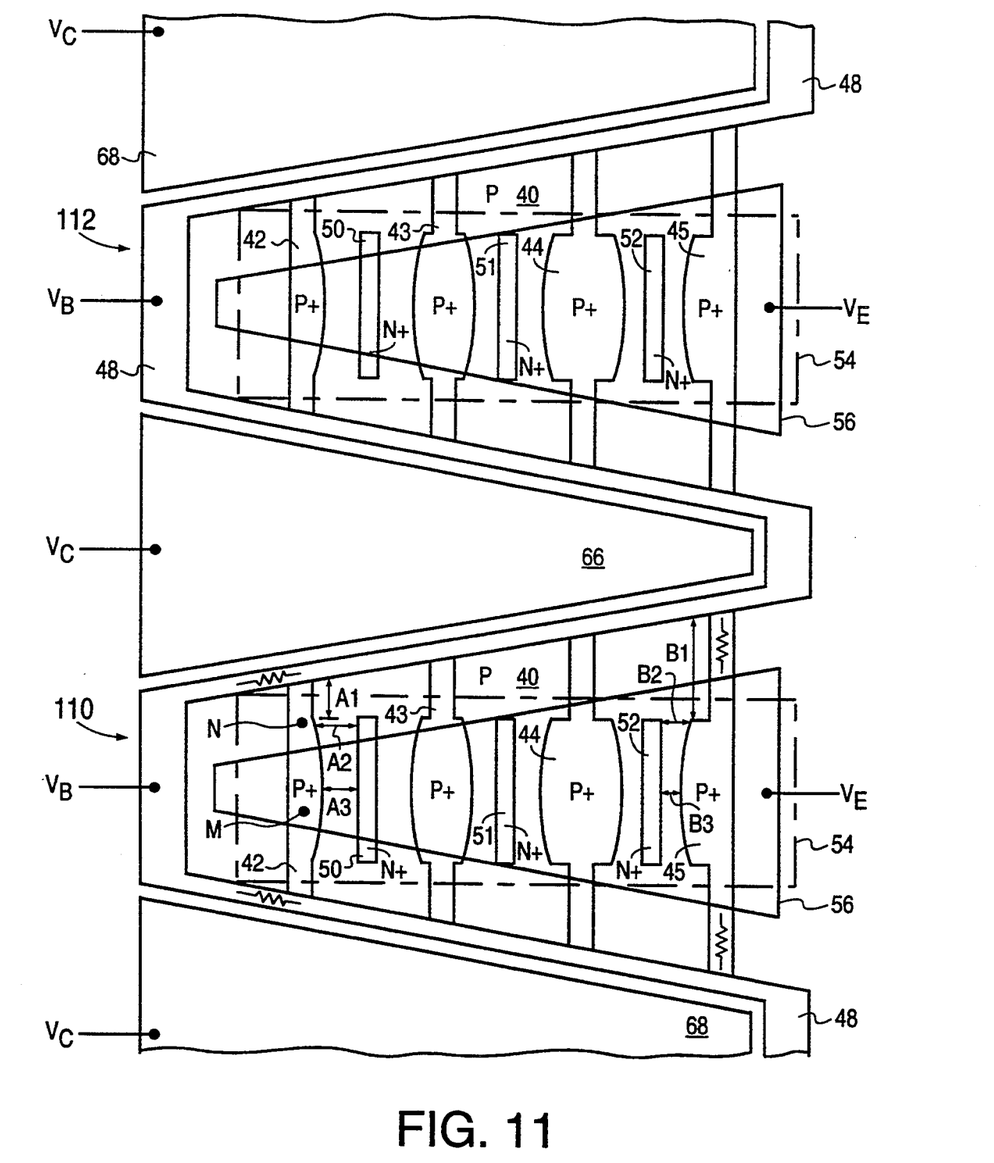
FIG. 11 is a top plan view illustrating an alternative embodiment of the transistor structure of FIG. 2.

FIG. 11 illustrates three general modifications to the transistor structure of FIG. 2 which serve to improve its performance and reduce its size. Elements in FIG. 11 are similar to those elements in FIG. 2 having corresponding numerical designations. Certain elements have not been included in FIG. 11 for simplicity.

The structure of FIG. 11 is formed with the identical process steps as shown with respect to FIGS. 3–10b; however, the geometry of certain masks have been modified as discussed below.

Masks involved in forming the emitter metal 56, base metal 48, and collector metal 66, 68 have been modified to cause these metal portions to have a tapered shape. The resulting transistor structure is trapezoidal in shape.

Since each of the transistors in the transistor structure of FIG. 11 are connected in parallel and each transistor contributes an equal portion of current to the total emitter current, the emitter current flowing through the right end of emitter metal 56 is greater than the current which flows through the left end of emitter metal 56. Accordingly, the current handling capability of emitter metal 56 must be greater at its right end than at its left end. Therefore, emitter metal 56 can be made narrower as it proceeds to the left, since it needs to carry less and less current.

This tapering of emitter metal 56 results in a smaller area of silicon required for the transistor structure of FIG. 11 than for the transistor structure of FIG. 2.

As shown in FIG. 11, the base metal 48 and collector metal 66, 68 and associated underlying regions are also formed to taper to correspond with and complement the tapering of the emitter metal 56. This resulting structure is very useful when forming a number of these transistor structures on a single integrated circuit, since the tapers of adjacent structures enable the transistors to be placed closer together, as illustrated by transistor structures 110 and 112 shown in FIG. 11.

Another modification to the structure of FIG. 2 illustrated in FIG. 11 is the widening of P+ base contact regions 42–45 (formed as strips) toward the middle of P+ regions 42–45 in order to compensate for the resistance along P+ regions 42–45. For example, a base bias voltage $V_B$ at point N on P+ region 42 of transistor structure 110, relatively close to base metal 48, will be a higher voltage than at point M, near the middle of P+ region 42, due to the resistance along P+ region 42. To present a same base bias voltage $V_B$ along the entire length of N+ emitter region 50, P+ region 42 is widened at its middle portion to reduce the length of the P-well (and consequently the P-well's resistance) between the middle of P+ region 42 and N+ emitter region 50. The resulting $V_B$ as seen along the length of N+ emitter region 50 will be the same. The increase in width at the middle of P+ base contact region 42 is illustrated by the length A2 being greater than A3.

The widths of each of the other P+ base contact regions 43–45 are similarly adjusted.

This same concept may also be applied to the shapes of the emitter regions 50–52, where the middle sections of emitter regions 50–52 may bulge out instead of the middle sections of P+ regions 42–45.

Additionally, a third modification to the structure of FIG. 2 which is shown in FIG. 11 is the varying of the pitch between the P+ base contact regions 42–45 to compensate for the base metal 48 resistance and increasing length of P+ regions 42–45 as the P+ regions 42–45 are formed farther and farther from the source of the base bias voltage $V_B$. In FIG. 11, this is illustrated by the maximum and minimum distances between P+ base contact region 42 and emitter region 50 being A2 and A3, respectively, while the maximum and minimum distances between P+ base contact region 45 and emitter region 52 are B2 and B3, respectively, where B2 is less than A2 and B3 is less than A3.

Such variations in the pitch of the P+ base contact regions 42–45 help maintain a same $V_{BE}$ for each of the transistors along the linear array of transistors in the transistor structure. This is very significant for a relatively long train of parallel transistors where the base metal voltage drop becomes even more significant.

Figure 12:
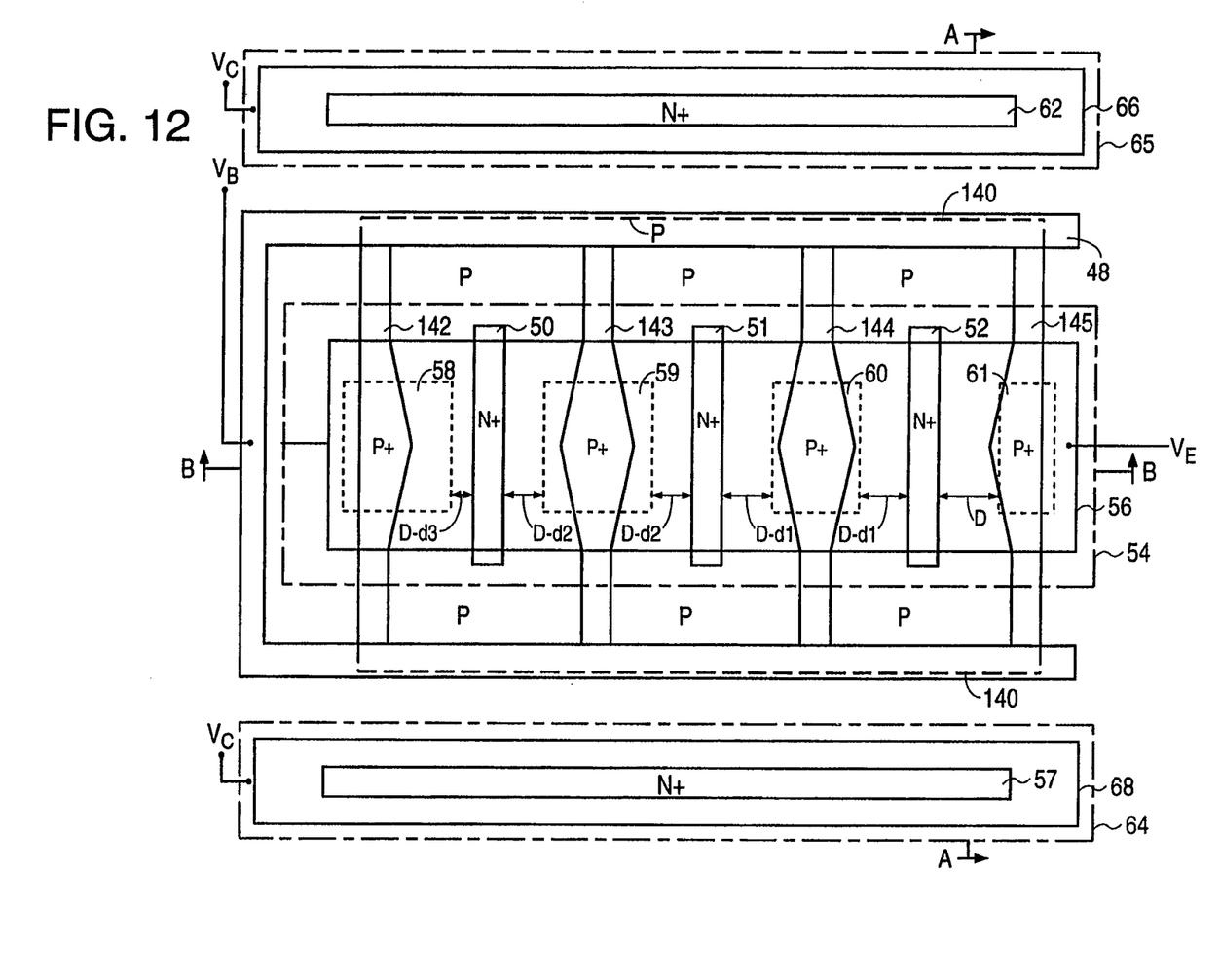
FIG. 12 is a top plan view illustrating a composite of various masks used to form a second transistor structure of the present invention.

FIG. 12 illustrates a transistor structure which is slightly modified from the structure shown in FIG. 2. FIG. 12 shows a dashed outline of a standard three micron P-base 140, instead of the deep (5–7 micron) P-well 40 shown in FIGS. 2 and 10a. P-base 140 is formed by doping a rectangular region in an N-type epitaxial layer. Within P-base 140 are formed strips of P+ regions 142–145, which form low resistivity base contacts in P-base 140. In this embodiment, the shape of each base contact P+ region 142–145 varies to equalize the $V_{BE}$ along the lengths of the P+ regions 142–145, as previously described with respect to FIG. 11. Varying sizes of contact openings 58–61 are used to connect emitter metal 56 to polysilicon layer 54, as previously described with respect to FIG. 2. The rest of the structure of FIG. 12 is substantially identical with the embodiment of FIG. 2, with the reference numbers of like structures being preserved.

The structure of FIG. 12 is formed as described above for the previous embodiment except that P-base 140 is formed shallower and more heavily doped than the deep P-well 40 in FIGS. 6a and 6b. Further, P+ regions 142–145 are formed to be four microns thick instead of the three micron thick P+ regions 42–45 of FIG. 6a. Still further, in another embodiment, after polysilicon layer 54 is doped to form the N+ emitter regions 50–52, it is doped further using phosphorus.

Figure 13:
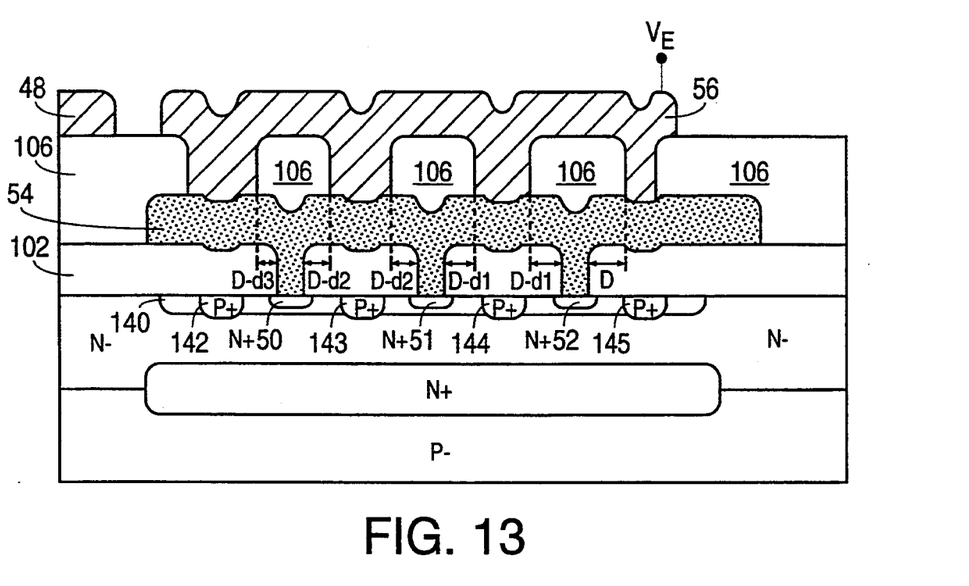
FIG. 13 is a cross-sectional view of the transistor structure of FIG. 12 along line B—B.

FIG. 13 is a cross-sectional view of the structure of FIG. 12 taken along line B—B and illustrates some of the differences between the structure of FIG. 12 and the structure of FIG. 2. P+ regions 142–145 (about 15 ohms/square) are slightly deeper than P-base 140 in this embodiment. Further, the higher dopant concentration of P-base 140 reduces the gain (beta) of the transistors in this structure to approximately 120 and decreases the resistivity of the base to approximately 120–130 ohms/square. The lower beta and lower base resistivity allow this structure to handle much larger voltages (exceeding 40 volts) than the previously described embodiments and generate less heat at a given voltage.

Thus, a number of improved transistor structures have been shown and described along with a preferred method for forming these structures.

Although an NPN transistor structure has been shown and described, a PNP transistor structure may be formed using substantially identical methods but with opposite conductivity type dopants.

Although transistor structures containing only three transistors in parallel have been specifically shown for simplicity, the invention described herein may be applied to transistor structures containing many more transistors or even only one transistor.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A bipolar transistor structure comprising:
   a semiconductor substrate having a substrate surface of a first conductivity type;
   a base region of a second conductivity type formed in said substrate surface, said base region acting as a base for said transistor;
   a plurality of emitter regions of said first conductivity type formed in a top surface of said base region;
   a first metal layer for conducting emitter current; and
   a plurality of polysilicon ballast resistors connected between associated emitter regions and said first metal layer, said polysilicon ballast resistors being doped with a dopant of said first conductivity type, said dopant in said polysilicon ballast resistors being diffused into said base region to form said associated emitter regions, wherein a first polysilicon ballast resistor connected between a first emitter region and said first metal layer has a resistance value which is greater than a resistance value of a second polysilicon ballast resistor connected between a second emitter region and said first metal layer, and wherein a resistance of said first metal layer between an emitter bias voltage source and said first polysilicon ballast resistor is less than a resistance of said first metal layer between said emitter bias voltage source and said second polysilicon ballast resistor.

2. The transistor structure of claim 1 wherein said polysilicon ballast resistors are doped a second time with a dopant of said first conductivity type after forming said associated emitter regions.

3. The transistor structure of claim 2 wherein said first emitter region is located closer to where said emitter bias voltage source contacts said first metal layer than said second emitter region.

4. The transistor structure of claim 1 wherein said base region of said second conductivity type has a resistivity of between approximately 1 kΩ/square and 5 kΩ/square.

5. The transistor structure of claim 4 wherein said base region has a depth of at least approximately five microns.

6. A bipolar transistor structure comprising:
   a semiconductor substrate having a substrate surface of a first conductivity type;
   a base region of a second conductivity type formed in said substrate surface, said base region acting as a base for said transistor;
   one or more emitter regions of said first conductivity type formed in a top surface of said base region;

a first metal layer for conducting emitter current;
one or more polysilicon ballast resistors connected between associated emitter regions and said first metal layer;
one or more oblong base contact regions formed in said base region, said base contact regions being of said second conductivity type and more highly doped than said base region, a portion of each of said base contact regions underlying said first metal layer and said polysilicon ballast resistors; and
a second metal layer for conducting base current, said second metal layer contacting only ends of said oblong base contact regions,
wherein emitter current in said first metal layer flows in a direction substantially perpendicular to base current flowing in a longitudinal direction in said oblong base contact regions to or from said second metal layer.

7. The transistor structure of claim 6 wherein said second metal layer has one or more sides substantially parallel to one or more corresponding sides of said first metal layer.

8. The transistor structure of claim 6 wherein said first metal layer overlies said polysilicon ballast resistors and portions of said base contact regions and contacts said polysilicon ballast resistors through one or more openings formed in an insulating layer between said first metal layer and said polysilicon ballast resistors.

9. The transistor structure of claim 6 wherein said emitter regions are oblong-shaped and have longitudinal axes substantially parallel to longitudinal axes of said oblong base contact regions, wherein said first metal layer carries emitter current in a direction substantially perpendicular to said longitudinal axes of said emitter regions and said base contact regions.

10. The transistor structure of claim 1 wherein said first metal layer overlies said polysilicon ballast resistors and contacts said polysilicon ballast resistors through one or more openings formed in an insulating layer between said first metal layer and said polysilicon ballast resistors.

11. The transistor structure of claim 1 wherein said plurality of polysilicon ballast resistors comprise a single polysilicon layer which contacts said top surface of said base region through one or more openings formed in an insulating layer between said polysilicon layer and said top surface of said base region.

12. The transistor structure of claim 1 wherein said substrate surface of a first conductivity type is an epitaxial layer, and a buried collector region of said first conductivity type is formed in said epitaxial layer to conduct collector current.

13. The transistor structure of claim 1 wherein said emitter regions are formed as strips in said base region, said emitter regions being substantially parallel to each other.

14. The transistor structure of claim 1 further comprising:
a second metal layer for conducting base current; and
a plurality of base contact regions of said second conductivity type formed in said top surface of said base region and contacting said second metal layer, each of said base contact regions being more highly doped than said base region, each of said base contact regions being associated with an emitter region, wherein a distance between a first one of said base contact regions and an associated first emitter region is less than a distance between a second one of said base contact regions and an associated second emitter region to cause a base-emitter voltage between said first emitter region and said base region to be substantially equal to said base-emitter voltage between said second emitter region and said base region.

15. The transistor structure of claim 1 further comprising:
a second metal layer for conducting base current; and
one or more base contact regions of said second conductivity type formed in said top surface of said base region and contacting said second metal layer, each of said base contact regions being more highly doped than said base region, each of said base contact regions being formed as strips in said base region substantially parallel to emitter regions of said plurality of emitter regions and being connected to said second metal layer at ends of said base contact regions, wherein a shape of one or more of said base contact regions is varied along a length of said one or more base contact regions to cause a base-emitter voltage along a length of said one or more emitter regions to be substantially constant despite variations in base bias potential along said length of said one or more base contact regions due to a resistance of said base contact regions.

16. The transistor structure of claim 1 wherein said plurality of emitter regions are formed as a linear array of emitter regions, and said first metal layer is formed overlying and insulated from said base region and in electrical contact with each of said polysilicon ballast resistors, said first metal layer having a first width at a first end of said linear array of said emitter regions where said first metal layer receives an emitter bias voltage from an emitter bias voltage source and conducts a maximum emitter current, and wherein said first metal layer tapers from said first width to become narrower as said first metal layer extends away from said first end of said first metal layer.

17. The transistor structure of claim 16 further comprising:
a second metal layer for conducting base current; and
base contact regions of a second conductivity type being formed in said base region, said base contact regions being formed between adjacent ones of said emitter regions, said second metal layer contacting ends of said base contact regions, said second metal layer having an angle of taper approximately equivalent to said taper of said first metal layer.

18. A bipolar transistor structure comprising:
a semiconductor substrate having a substrate surface of a first conductivity type;
a base region of a second conductivity type formed in said substrate surface, said base region acting as a base for said transistor;
a plurality of oblong emitter regions of said first conductivity type formed in a top surface of said base region, each of said emitter regions being formed in said base region so as to form a linear array of emitter regions;
a plurality of oblong base contact regions of said second conductivity type formed in said top surface of said base region, each of said base contact regions being more highly doped than said base region, each of said oblong base contact regions being substantially parallel to said oblong emitter regions;

a doped polysilicon layer overlying and insulated from said base region and said base contact regions and contacting said emitter regions, said polysilicon layer having a resistance;

an emitter metal layer overlying said polysilicon layer and contacting said polysilicon layer at selected areas on said polysilicon layer, said emitter metal layer conducting emitter current, whereby emitter current flows between said emitter regions and said emitter metal layer through said polysilicon layer, said polysilicon layer providing emitter ballast resistance for each transistor formed with said transistor structure; and a base metal layer for conducting base current, said base metal layer contacting each of said oblong base contact regions only at ends of said base contact regions so as to energize said base contact regions with a base bias voltage.

19. The transistor structure of claim 18 wherein said emitter metal layer is formed to have a tapered shape along said linear array of emitter regions.

20. A transistor structure of claim 18 further comprising:

a buried collector region of said first conductivity type formed within said semiconductor substrate and formed below a bottom surface of said base region; and a collector metal layer connected to said buried collector region for conducting collector current.

21. A bipolar transistor structure comprising:

a semiconductor substrate having a substrate surface of a first conductivity type;

a base region of a second conductivity type formed in said substrate surface, said base region acting as a base for said transistor;

a plurality of emitter regions of said first conductivity type formed in a top surface of said base region;

a first metal layer for conducting emitter current;

a plurality of polysilicon ballast resistors, each ballast resistor being connected between an associated emitter region and said first metal layer, wherein a first polysilicon ballast resistor connected between a first emitter region and said first metal layer has a resistance value which is greater than a resistance value of a second polysilicon ballast resistor connected between a second emitter region and said first metal layer, and wherein a resistance of said first metal layer between an emitter bias voltage source and said first polysilicon ballast resistor is less than a resistance of said metal layer between said emitter bias voltage source and said second polysilicon ballast resistor;

one or more oblong base contact regions formed in said base region, said base contact regions being of said second conductivity type and more highly doped than said base region, a portion of each of said base contact regions underlying said first metal layer and said polysilicon ballast resistors; and a second metal layer for conducting base current, said second metal layer contacting only ends of said oblong base contact regions, wherein emitter current in said first metal layer flows in a direction substantially perpendicular to base current flowing in a longitudinal direction in said oblong base contact regions to or from said second metal layer.

22. A bipolar transistor structure comprising:

a semiconductor substrate having a substrate surface of a first conductivity type;

a base region of a second conductivity type formed in said substrate surface, said base region acting as a base for said transistor;

a plurality of emitter regions of said first conductivity type formed in a top surface of said base region;

a metal layer for conducting base current; and a plurality of base contact regions of said second conductivity type formed in said top surface of said base region and contacting said metal layer, each of said base contact regions being more highly doped than said base region, each of said base contact regions being associated with an emitter region, wherein a distance between a first one of said base contact regions and an associated first emitter region is less than a distance between a second one of said base contact regions and an associated second emitter region to cause a base-emitter voltage between said first emitter region and said base region to be substantially equal to said base-emitter voltage between said second emitter region and said base region.

23. A bipolar transistor structure comprising:

a semiconductor substrate having a substrate surface of a first conductivity type;

a base region of a second conductivity type formed in said substrate surface, said base region acting as a base for said transistor;

one or more emitter regions of said first conductivity type formed in a top surface of said base region, each of said emitter regions being formed as substantially rectangular strips in said base region;

a metal layer for conducting base current; and one or more base contact regions of said second conductivity type formed in said top surface of said base region and contacting said metal layer, each of said base contact regions being more highly doped than said base region, each of said base contact regions being formed as strips in said base region substantially parallel to said emitter regions and being connected to said metal layer at ends of said base contact regions, wherein a shape of one or more of said base contact regions is varied along a length of said one or more base contact regions to cause a base-emitter voltage along a length of said one or more emitter regions to be substantially constant despite variations in base bias potential along said length of said one or more base contact regions due to a resistance of said base contact regions.

24. A bipolar transistor structure comprising:

a semiconductor substrate having a substrate surface of a first conductivity type;

a base region of a second conductivity type formed in said substrate surface, said base region acting as a base for said transistor;

a plurality of emitter regions of said first conductivity type formed in a top surface of said base region, said emitter regions being formed as a linear array of emitter regions; and a first metal layer for conducting emitter current, said first metal layer being formed overlying and insulated from said base region and in electrical contact with each of said emitter regions, said first metal layer having a first width at a first end of said linear array of said emitter regions where said first metal layer receives an emitter bias voltage from an emitter bias voltage source and conducts a maximum emitter current, and wherein said first metal layer tapers from said first width to become narrower as said first metal layer extends away from said first end of said first metal layer.

25. The transistor structure of claim 24 further comprising:

a second metal layer for conducting base current; and base contact regions of a second conductivity type being formed in said base region, said base contact regions being formed between adjacent ones of said emitter regions, said second metal layer contacting ends of said base contact regions, said second metal layer having an angle of taper approximately equivalent to said taper of said first metal layer.

26. The transistor structure of claim 1 wherein said base region of said second conductivity type has a resistivity of between approximately 120 $\Omega$/square and 130 $\Omega$/square.

27. The transistor structure of claim 1 wherein said base region has a depth of approximately three microns.

* * * * *